US006961691B1

(12) United States Patent
Selvidge et al.

(10) Patent No.: US 6,961,691 B1
(45) Date of Patent: Nov. 1, 2005

(54) NON-SYNCHRONIZED MULTIPLEX DATA TRANSPORT ACROSS SYNCHRONOUS SYSTEMS

(75) Inventors: Charles W. Selvidge, Wellesley, MA (US); Kenneth W. Crouch, Cambridge, MA (US); Muralidhar R. Kudlugi, Framingham, MA (US); Soha M. N. Hassoun, Lexington, MA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 09/539,463

(22) Filed: Mar. 30, 2000

(51) Int. Cl.[7] .............................................. G06F 9/455
(52) U.S. Cl. .......................................... 703/28; 703/23
(58) Field of Search .................................... 703/23, 28

(56) References Cited

U.S. PATENT DOCUMENTS

| | | | | |
|---|---|---|---|---|
| 3,873,920 A | | 3/1975 | Apple, Jr. et al. | |
| 5,297,181 A | * | 3/1994 | Barr et al. | 375/373 |
| 5,596,742 A | * | 1/1997 | Agarwal et al. | 716/16 |
| 5,649,176 A | | 7/1997 | Selvidge et al. | 395/551 |
| 5,659,716 A | * | 8/1997 | Selvidge et al. | 703/23 |
| 5,761,484 A | * | 6/1998 | Agarwal et al. | 716/16 |
| 5,802,348 A | | 9/1998 | Stewart et al. | 395/500 |
| 5,847,578 A | | 12/1998 | Noakes et al. | 326/39 |
| 5,850,537 A | | 12/1998 | Selvidge et al. | 395/500 |
| 5,854,752 A | | 12/1998 | Agarwal | 364/489 |
| 5,943,490 A | * | 8/1999 | Sample | 703/28 |
| 5,960,191 A | * | 9/1999 | Sample et al. | 703/28 |
| 6,061,511 A | * | 5/2000 | Marantz et al. | 703/28 |
| 6,836,757 B1 | * | 12/2004 | Swoboda | 703/25 |

FOREIGN PATENT DOCUMENTS

| | | |
|---|---|---|
| EP | 0 286 609 | 10/1988 |
| EP | 1 077 532 | 2/2001 |
| WO | WO 94/06210 | 3/1994 |

OTHER PUBLICATIONS

C. Selvidge, A. Agarwal, M. Dahl, J. Babb, "TIERS: Topology Independent Pipelined Routing and Scheduling for VirtualWire Compilation", ACM , 0-7695-2550-4/95, 1995, 7 pages.*
European Search Report.
A. S. Tanenbaum, "Computer-Netzerke", Wolfram's Fachverlag, Attenkirchen, 1992, pp. 71-72, 170-173.
D. E. Van Den Bout et al., "AnyBoard: An FPGA-Based, Reconfigurable System", IEEE Design & Test Of Computers, IEEE Computers Society, vol. 9, No. 3, Sep. 1992, pp. 21-30.
P. Schicker, "Datenübertragung und Rechnernetze", 1983, Teubner, Stuttgart, pp. 12-15.
Andrew S. Tanenbaum, Computer Networks, 1996, Prentice Hall, Upper Saddle River, New Jersey, USA, pp. 279-281.
Andrew S. Tanenbaum, Computer Networks, 1196, Prentice Hall, Upper Saddle River, New Jersey, USA, pp. 81.

* cited by examiner

*Primary Examiner*—Kevin J. Teska
*Assistant Examiner*—Dwin M. Craig
(74) *Attorney, Agent, or Firm*—Banner & Witcoff, Ltd.

(57) ABSTRACT

A method allows two substantially asynchronous system components of a logic emulation system to exchange data packets with reference to a clock signal of predetermined frequency. In one example, each bit is transmitted across the system components over two or more cycles of the clock signal. The reference clock signal can be distributed to the two system components from a common clock signal generator, or can be generated locally independently.

16 Claims, 5 Drawing Sheets

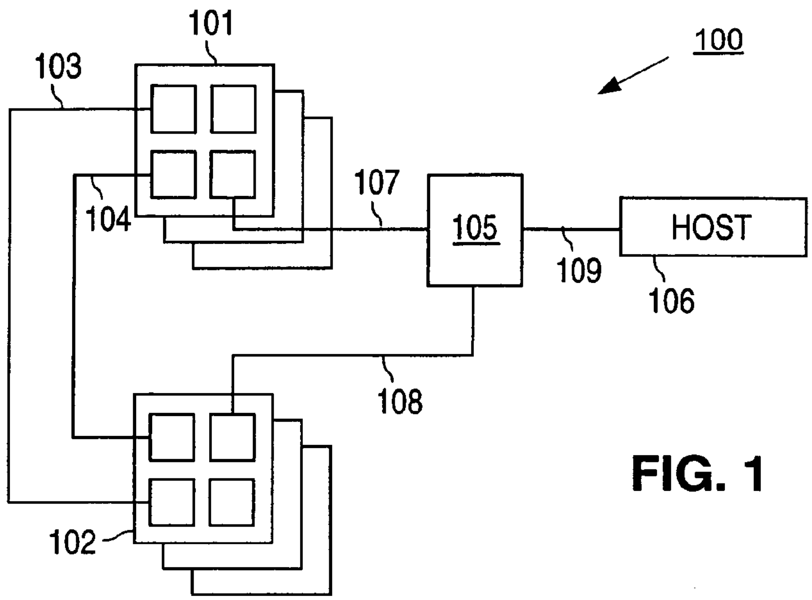
FIG. 1
FIG. 2
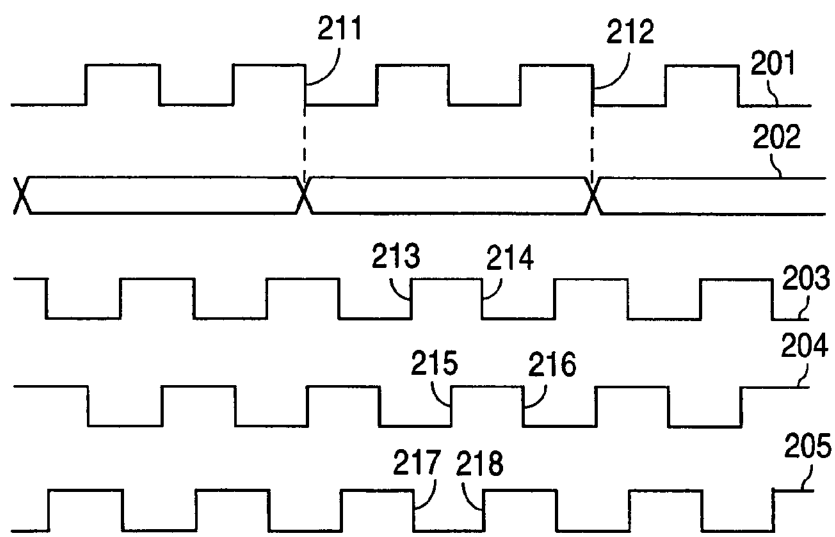
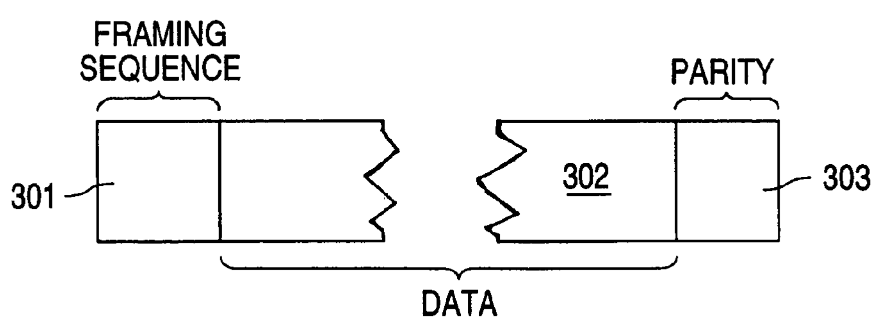
FIG. 3

NON-SYNCHRONIZED MULTIPLEX DATA TRANSPORT ACROSS SYNCHRONOUS SYSTEMS

BACKGROUND OF THE INVENTION

1. Field of the Invention

The present invention relates to logic circuit emulation systems. In particular, the present invention relates to providing data transport across practically asynchronous portions of a logic circuit emulation system.

2. Discussion of the Related Art

A typical emulation system for a large logic circuit is described, for example, in U.S. Pat. No. 5,761,484, entitled "Virtual Interconnections For Reconfigurable Logic Systems," to Agarwal et al. Such an emulation system is often used during the development of an integrated circuit to simulate circuit operation and circuit performance. In such a system, the designer provides a logic netlist that is then partitioned by the emulation system for implementing an emulation circuit configured in a number of programmable logic devices (e.g., field programmable gate arrays or FPGAs). These programmable logic circuits (PLDs) are typically provided on one or more circuit boards in the emulation system, with each circuit board containing a number of these programmable logic devices connected in a convenient topology.

Many techniques for efficiently implementing the emulation circuit have been developed. For example, U.S. Pat. No. 5,761,484, entitled "Virtual Interconnections for Reconfigurable Logic Systems" to Agarwal et al., provides an efficient method to route signals between the PLDs by "multiplexed data transport," i.e., sharing input or output pins among many input or output signals. In one implementation of that system, a clock signal ("virtual clock") of many times the frequency of the system clock is used for these input and output signals. U.S. Pat. No. 5,854,752, entitled "Circuit Partitioning Technique For Use With Multiplexed Interconnections" to Agarwal, provides an efficient way of circuit partitioning that achieves high utilization of the available resources in the PLDs. U.S. Pat. Nos. 5,659,716 and 5,850,537, both entitled "Pipelined Static Router And Scheduler For Configurable Logic System Performing Simultaneous Communications and Computation" to Selvidge et al., disclose methods for efficiently routing among PLDs signals under timing constraints. U.S. Pat. No. 5,802,348, entitled "Logic Analysis System For Logic Emulation Systems" to Stewart et al., provides logic analyzer functions to be used in analyzing the operations within the emulation circuit.

In a large logic circuit, circuit operations are controlled by one or more clock signals. Thus, proper handling of clock signals is important to achieve a successful emulation of a logic circuit. For example, U.S. Pat. No. 5,649,176, entitled "Transition Analysis And Circuit Resynthesis Method and Device For Digital Circuit Modeling," discloses using an internal clock signal outside of the timing signals of the logic circuit to control the internal operations of the emulation circuit. In a typical emulation system, a single clock signal is distributed throughout the emulated logic circuit to provide synchronization. While this clock distribution scheme is conventional in an emulation circuit configured in PLDs in very close proximity (e.g., PLDs on a single circuit board, or on different circuit boards interconnected on a single backplane bus), such a clock signal cannot be provided between PLDs separated by a relatively large distance (e.g., PLDs on circuit boards on different chassis) or at high clock frequencies, such as those used for multiplexed data transport. In such a system, there may be large clock skews at different points of the system relative to the clock period that cannot be reliably estimated. Thus, practically, those different points of the system are effectively asynchronous relative to each other. Thus, there is a need for a reliable method for transporting data between distinct asynchronous components of a system, without relying on a common clock signal distributed throughout.

Asynchronous communication can be carried out by: (a) providing explicit flow control signals, (b) embedding a clock signal in a data signal, and extracting the clock signal in a decoding circuit during decoding, and (c) providing a frequency-controlled clock signal, and encoding both data and clock phase, and reconstructing clock signal phase during decoding.

SUMMARY OF THE INVENTION

The present invention provides methods and systems for reliably transmitting data across two emulation systems that are substantially asynchronous relative to each other.

According to one embodiment of the present invention, method for transmitting a data packet between asynchronous systems includes: (a) providing a transmit clock signal of a predetermined frequency; (b) transmitting a framing sequence serially over a connection between the asynchronous systems, in accordance with the transmit clock signal; and (c) subsequent to transmitting the framing sequence, transmitting the data packet serially over the connection. Under that method, each bit in the framing sequence and the data packet is transmitted over two transmit clock periods. Symmetrically, one embodiment of the present invention provides a method for receiving a data packet between asynchronous systems, which includes: (a) providing a receive clock signal of a predetermined frequency; (b) detecting a framing sequence transmitted serially over a connection between the asynchronous systems, in accordance with a receive clock signal; and (c) subsequent to receiving the framing sequence, receiving the data packet serially over the connection. Under that receiving method also, each bit in said framing sequence and said data packet is received over two receive clock periods.

According to another aspect of the present invention, an emulation system is provided that includes: (a) a circuit board provided with programmable logic devices for implementing an emulation circuit and a transceiver circuit, the circuit board receiving a clock signal of a predetermined frequency; (b) a controller coupled to a host computer, the controller having a transceiver circuit for communicating with the transceiver circuit of the circuit board and also receiving a clock signal of the predetermined frequency; and (c) a connection between said transmitter circuit and the receiver circuit. In this emulation system, each bit of data transmitted over the connection has a duration of two or more periods of the clock signal received at the circuit board. In one implementation, the clock signal received at the circuit board and the clock signal received at the controller are provided by a common source. Alternatively, the clock signals for the transmitter circuit and the receiver circuit are generated independently. Such a clock signal can be provided by a virtual clock signal, or can be provided by a clock signal twice the frequency of the virtual clock signal. Using a transmit clock signal at twice the frequency of the virtual clock signal allows data to be transmitted at the virtual clock rate between the controller and the circuit board.

In a second embodiment, the method of the present invention is applied to two circuit boards housed on different chassis of an emulation system.

The present invention is better understood upon consideration of the detailed description below and the accompanying drawings.

BRIEF DESCRIPTION OF THE DRAWINGS

FIG. 1 shows emulation system 100 in which multiplexed data transport methods of the present invention are applicable.

FIG. 2 shows transmit clock 201, data signal 202 and receive clocks 203, 204 and 205.

FIG. 3 shows a data packet transmitted over data signal 202.

DETAILED DESCRIPTION OF THE PREFERRED EMBODIMENTS

Figure 4A:
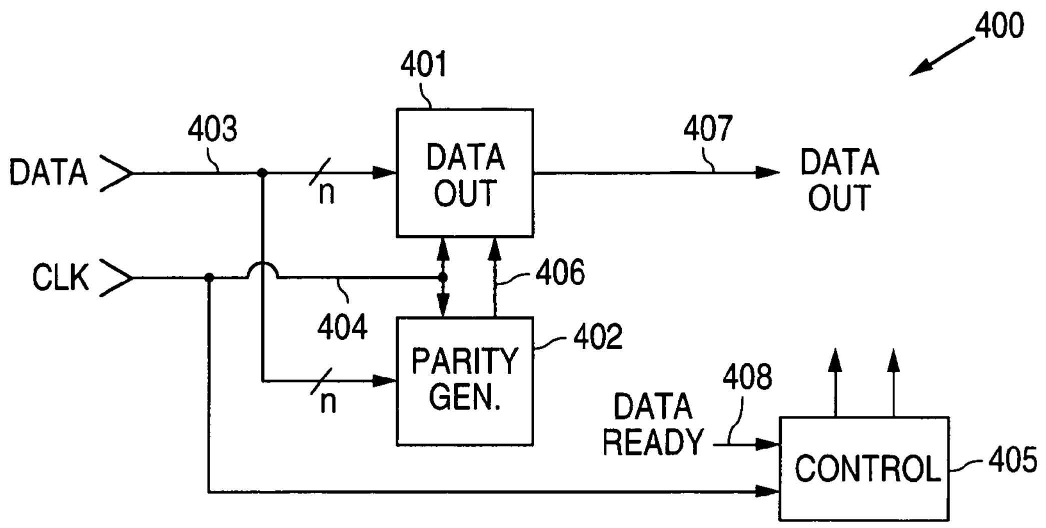
FIG. 4*a* is a block diagram of transmitter circuit 400 according to one embodiment of the present invention

The present invention is applicable to an emulation system, such as that shown in FIG. 1. As shown in FIG. 1, emulation system 100 includes two groups of circuit boards 101 and 102, each group having a number of circuit boards populated by field programmable gate arrays (FPGAs) which can be configured by controller 105 to emulate a user circuit. Signals between circuit board groups 101 and 102 are provided over a number of wires, such as wires 103 and 104 shown in FIG. 1. Some of these signals can be signals in the emulation circuit configured in circuit board groups 101 and 102, and may be uni-directional or bi-directional. In this embodiment, circuit board groups 101 and 102 are housed in different equipment chassis. Controller 105 also controls the operation of circuit boards 101 and 102 and receives selected signals from the emulation circuit configured in circuit board groups 101 and 102. Terminals 107 and 108 represent, respectively, wires connecting logic signals from the emulation circuit configured in circuit board groups 101 and 102 to controller 105. Controller 105 can communicate with host computer 106 over system bus 109, for example.

According to one embodiment of the present invention, data can be communicated over terminals 103, 104, 107 and 108 without a common low-skew clock signal synchronized throughout emulation system 100. Instead, each of circuit board groups 101 and 102, and controller 105 has access to a clock signal of a common predetermined frequency. Access to such a clock signal can be provided, for example, by transmitting a master clock throughout the system, even though the phase relationship between any two points receiving this clock signal cannot be easily determined. In one embodiment, controller 105 receives a clock signal common with one of circuit board groups 101 and 102. Alternatively, each device can generate a clock signal of the specified frequency locally. In one embodiment, each of circuit board groups 101 and 102 generates its own common frequency clock signal. In either situation, the phase of each clock signal in circuit board groups 101, 102 and controller 105 relative to each other is undetermined. For such clock signals, the total number of bits ("data size") per transmission is substantially given by the following constraint which is a function of the tolerance of frequency variation (Δf):

$$(2*\text{data\_size})*2*\Delta f*T \leq \frac{T}{2}-(T_{setup}+T_{hold}+T_{skew})$$

where data_size is the number of bits in the transmission, T is the nominal clock period, $T_{setup}$ and $T_{hold}$ are, respectively, the setup and the hold times, and $T_{skew}$ is the accumulated skew in the rise and fall times, due to propagation rate variations. In one embodiment, a data size of in excess of 100 bits is achievable. The data packet may be provided as fixed size or variable size.

According to one embodiment of the present invention, data is sent between circuit board groups 101 and 102, and controller 105 at one-half the predetermined frequency of the clock signal in these circuits. FIG. 2 shows transmit clock 201, data signal 202 and potential receive clocks 203, 204 and 205. As shown in FIG. 2, receive clock signals 203, 204 and 205 are respectively, 90°, 180° and 270°out of phase relative to transmit clock 201. In FIG. 2, data signal 202 transitions at the falling edges 211 and 212 of transmit clock signal 202, so that each bit in data signal 202 remains valid for 2 cycles of transmit clock 201. Note that, each of clock signals 203–205 has both a rising edge (e.g., edges 213, 215 and 218) and a falling edge (e.g., edges 214, 216 and 217) that is more than 180° away from edges 211 and 212. By identifying an appropriate clock edge, data signal 202 can be sampled by any of receive clock signals 203, 204, 205 or any receive clock signal of an arbitrary phase relative to transmit clock 201.

A phase recovery circuit 300 for a receiver detects a "framing sequence" transmitted on data signal 202. FIG. 3 shows the packet structure of data sent over data signal 202, in one embodiment of the present invention. During idle periods (i.e., when no data is transmitting), a logic "0" is transmitted on data signal 202. However, as shown in FIG. 3, when a data packet is to be transmitted, framing sequence 301 is transmitted ahead of actual data 302. One or more parity bits 303 are sent to provide error detection. In one embodiment, the framing sequence is "01", so that each packet is separated by at least two receive clock cycles of logic "0".

FIG. 4*a* is a block diagram of transmitter circuit 400 according to one embodiment of the present invention. As shown in FIG. 4*a*, transmitter circuit 400 includes a data output circuit 401 which latches an n-bit data word from data bus 403 according to clock signal 404. Output circuit 401 transmits the latched data according to a transmit clock signal (not shown) on serial line 407. In one embodiment, the transmit clock signal is half the frequency of clock signal 404, which is typically the virtual clock signal. Parity generation circuit 402 computes one or more parity bits 406 to be transmitted with the output data on serial line 407. Control circuit 405 controls the operations of data output circuit 401 and parity generation circuit 402.

Figure 4B:
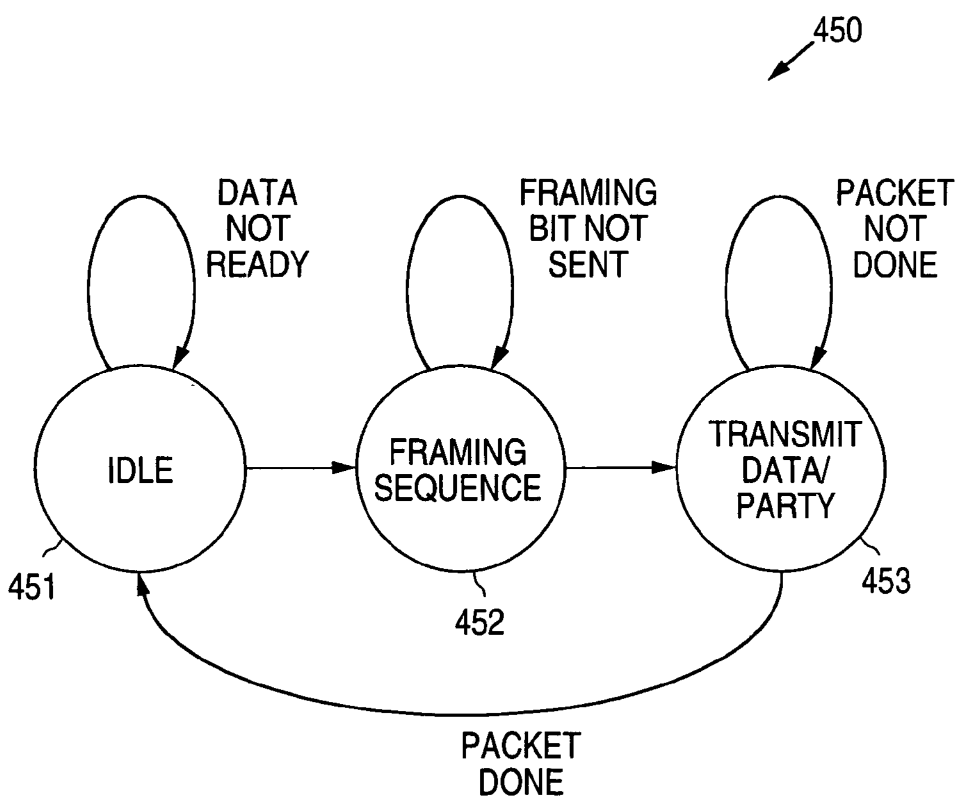
FIG. 4*b* is state diagram 450 that illustrates the control operations of control circuit 405.

FIG. 4*b* shows state diagram 450 that illustrates the control operations of control circuit 405. Initially, transmitter circuit 400 is in an idle state 451 until "data ready" signal 408 is asserted to indicate valid data on data bus 403. During this period, a logic "0" is repeatedly transmitted on serial line 407. When data ready signal 408 is asserted, the data on bus 403 is latched into data output circuit 401, and control circuit 405 enters state 452 in which the framing sequence is transmitted. In this embodiment, if the last data packet was sent more than two transmit clock cycles ago, only a logic "1" bit is transmitted in the next two cycles. Otherwise, a logic "0" is transmitted for two transmit clock cycles to ensure that the packets are separated by at least two clock cycles. After the framing sequence is transmitted, control circuit 405 enters state 453 in which the data latched into data output circuit 401 is serialized and transmitted on serial line 407 bit by bit, each bit being sent over two transmit clock cycles. At the end of data transmission, the parity data computed in parity generation circuit 402 is transmitted on serial line 407. The data packet is at that point completely transmitted. Control circuit 405 then returns to idle state 451. A reset signal can be provided to reset control circuit 405 back to state 451 at any time.

Figure 5A:
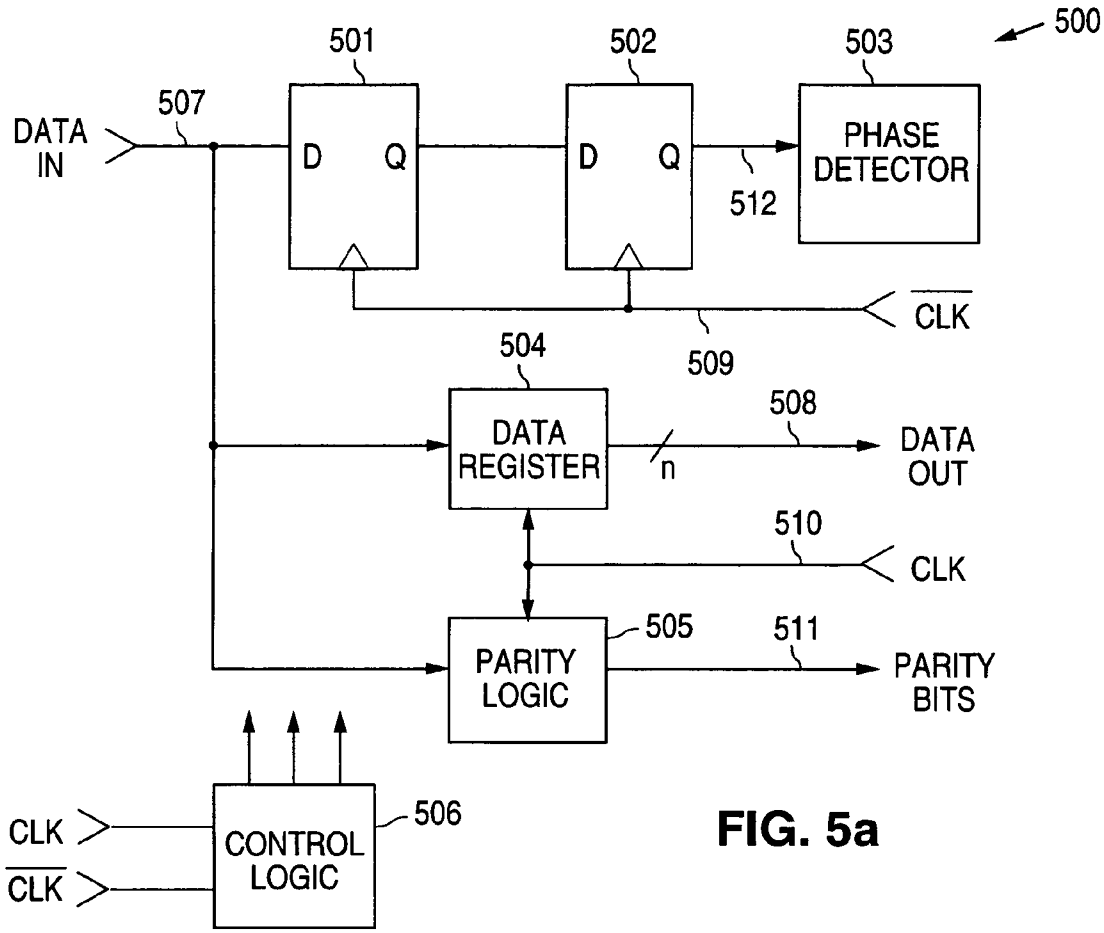
FIG. 5*a* is a block diagram of receiver circuit 500 in accordance with one embodiment of the present invention.

FIG. 5*a* is a block diagram of receiver circuit 500 in accordance with one embodiment of the present invention. As shown in FIG. 5*a*, serial data 507 is sampled by serially connected flip-flops 501 and 502 at the falling edges of clock signal 509, which has the same frequency as the transmit clock signal of transmitter 400 discussed above. The sampled signal (at terminal 512) is provided to phase detector 503 for detecting the framing sequence of a data packet. Data receiving circuit 504 and parity detection circuit 505 sample serial data 507 at half the clock rate of clock signal 510 upon detection of the framing sequence by phase detector 503. In one embodiment, clock signal 510 is a complementary signal of clock signal 509. In that embodiment, data receiving circuit 504 begins to sample serial data 507 at every second clock edge of clock signal 510, after phase detector 503 detects the first logic "1" at terminal 512. If parity detection circuit 511 does not detect an error in serial data 507, data receiving circuit 508 provides a parallel output on data bus 507. Control circuit 506 controls the operations of phase detector circuit 503, data receiving circuit 504 and parity detection circuit 505.

Figure 5B:
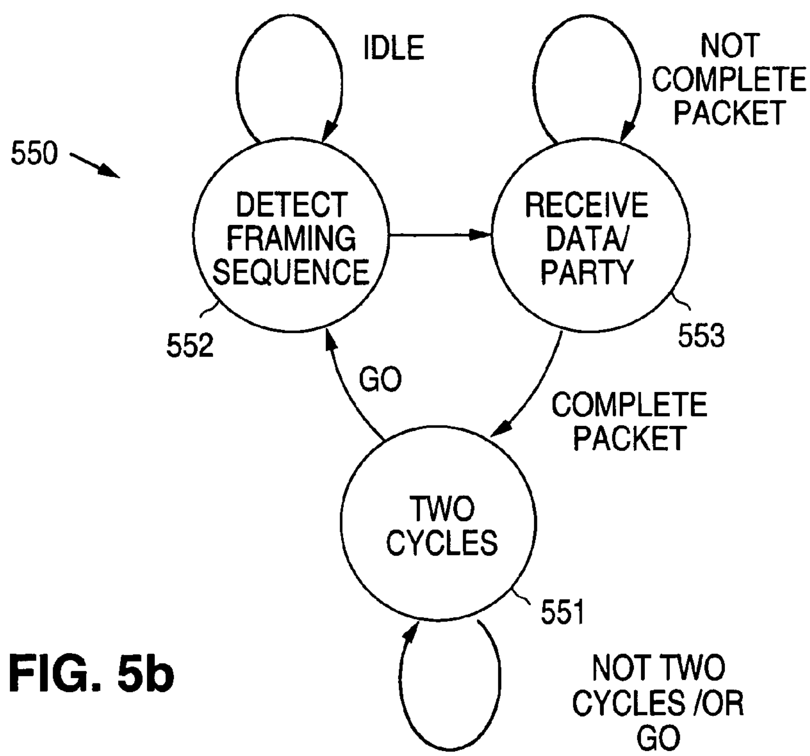
FIG. 5*b* is state diagram 550 showing the control operations of control circuit 506.

FIG. 5*b* shows state diagram 550 that illustrates the control operations of control circuit 506. Initially, control circuit 505 waits in state 551 for a "go" or ready signal to be asserted. When the go signal is asserted, control circuit 505 enters state 552 in which phase detector circuit 503 samples terminal 512 to detect the framing sequence. Once the framing sequence is detected, control circuit 505 enters state 553 in which data receiving circuit 504 and parity detection circuit 505 samples serial data 507 until the expected number of bits in the data packet are sampled. Control circuit 505 then returns to state 551 for at least two cycles until the go signal is asserted. A reset signal can be provided to reset control circuit 506 back to state 551 at any time.

Figure 6:
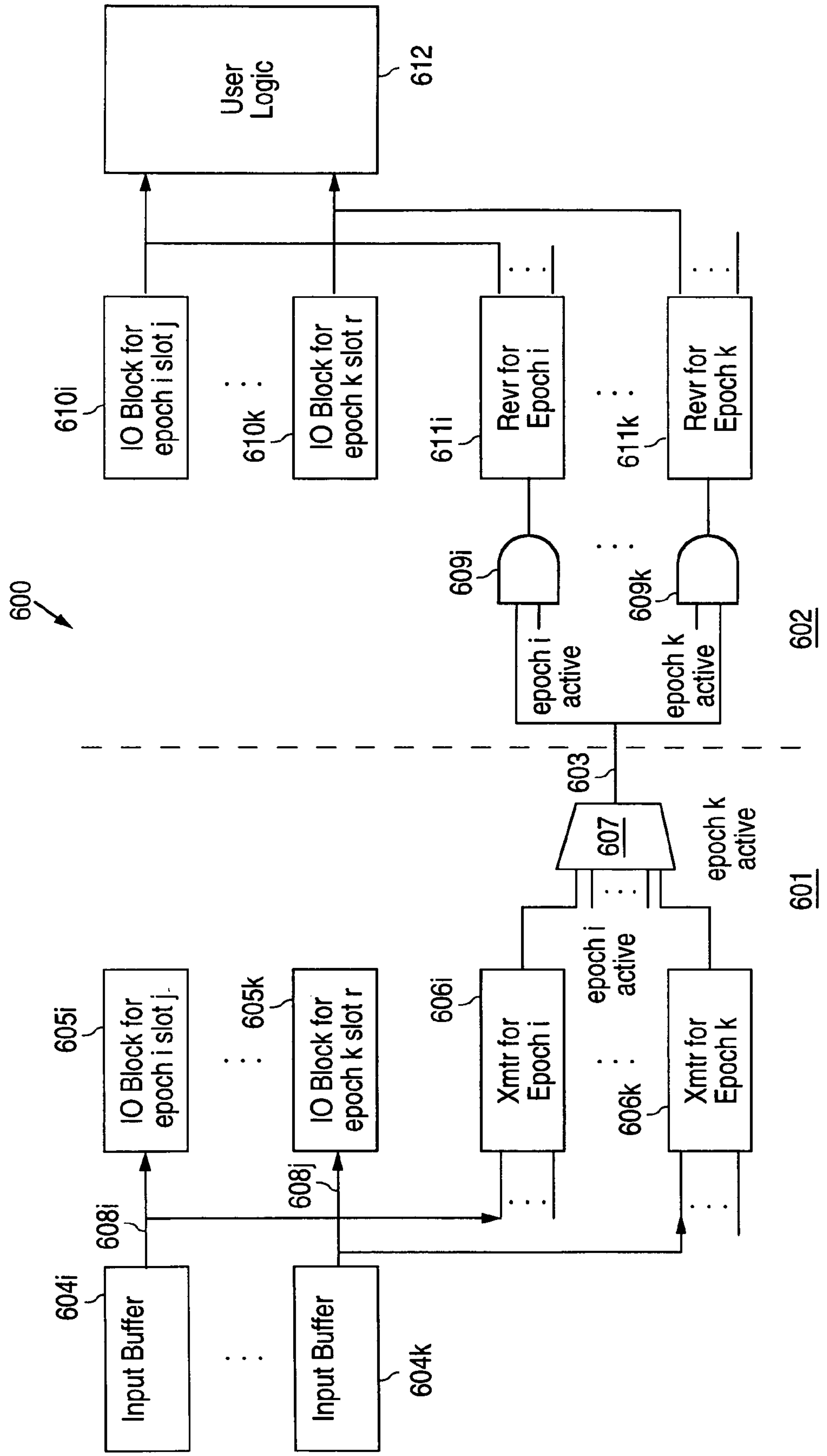
FIG. 6 shows circuit 600 that can be configured in an emulation circuit consisting of multiple circuit boards to effectuate data transfer.

Transmitter circuit 400 and receiver circuit 500 can be incorporated in an emulation circuit where data signals are to be sent between circuit boards that may reside in different chassis of the emulation system. FIG. 6 shows circuit 600 that can be configured in an emulation circuit consisting of multiple circuit boards to effectuate data transfer. As shown in FIG. 6, circuit 600 includes portions 601 and 602 that are to be configured in circuit boards of different chassis. Data is transmitted serially from portion 601 to portion 602 through connecting wire 603, using the protocol described above. Portion 601 includes a number of input buffers labeled 604*i* to 604*k*, corresponding to logic signals to be distribution to other parts of the emulation circuit according to their relevance for system clock periods ("epochs") i to k. Typically, the logic circuit signals in buffers 604*i* to 604*k* are collected from the user circuit to be emulated. During emulation, data signals organized by their respective epochs appear on corresponding connecting terminals 608*i* to 608*j* at each clock period of the virtual clock. Some of the signals at terminals 608*i* to 608*j* are fed back into circuits in portion 601 via IO blocks 605*i* to 605*j*. The signals at terminals 608*i* to 608*j* are also made available for transmission to portion 602 of the emulation circuit using transmitters 606*i* to 606*j*. Transmitters 606*i* to 606*k* can each be implemented by transmitter 400 described above. The output values of transmitters 606*i* to 606*j* are transmitted to portion 602 of emulation circuit 600 according to the transmit clock over connecting wire 603. Multiplexor 607 selects the output data of transmitters 606*i* to 606*j* onto connecting wire 603. In this embodiment, the transmit clock transmits at one half the frequency of the virtual clock. However, a phase-locked loop can be used create a clock signal which is double the frequency of the virtual clock. Such a clock signal would allow transmission to take place at the virtual clock rate.

In portion 603 of emulation circuit 600, data received on connecting wire 603 is demultiplexed according to epoch and provided to receivers 611*i* to 611*k* respectively. Receivers 611*i* to 611*k* can each be implemented by receiver 500 described above. The output values of receivers 611*i* to 611*k* are provided to user logic circuit 612 along with corresponding signals in IO blocks 610*i* to 610*k*.

Although the present invention is illustrated above using examples of wires carrying data in one direction, the present invention allows data to be communicated in both directions using one or more wires, by providing both transmitters and receivers at each interface.

Figure 7:
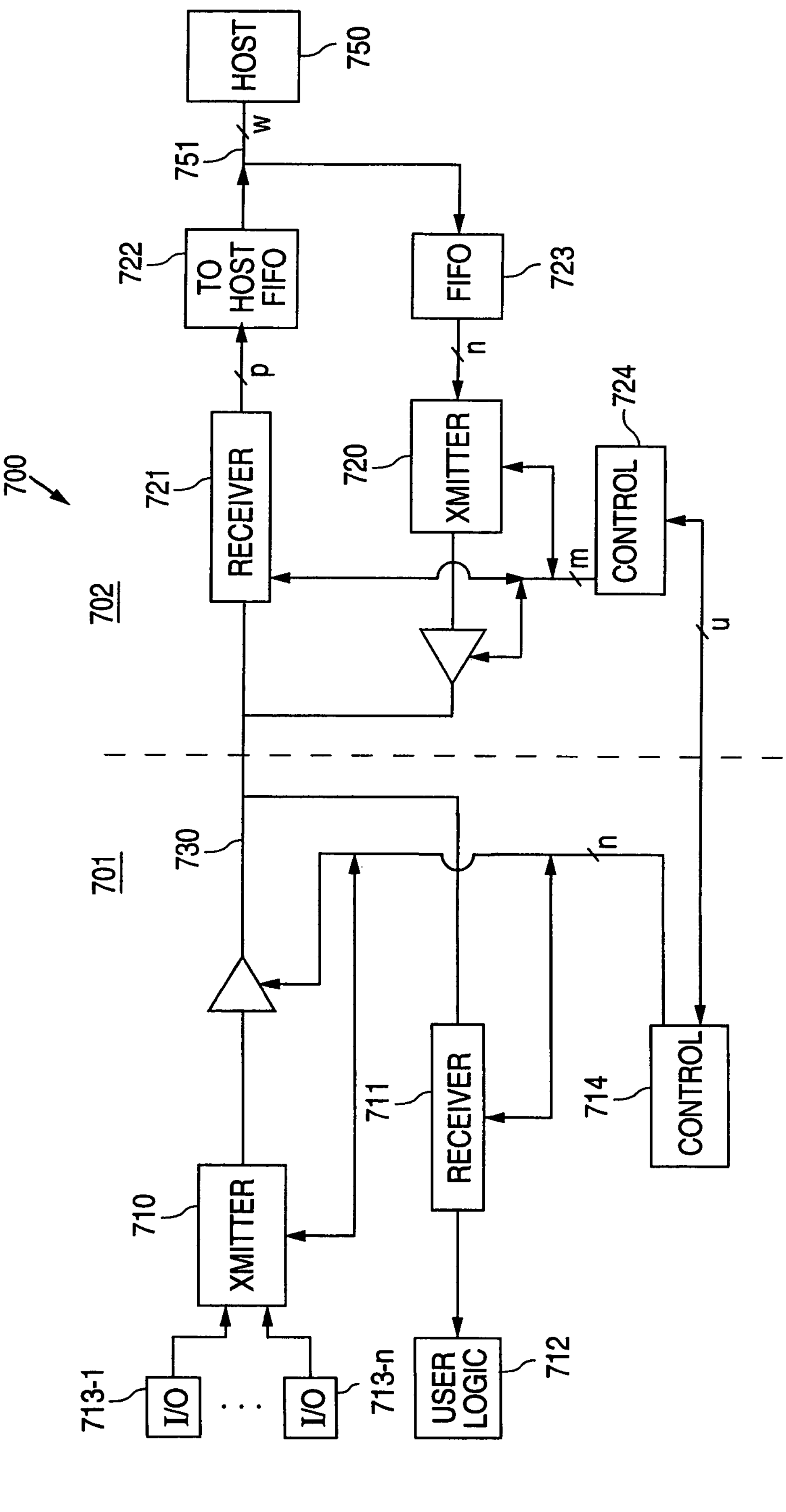
FIG. 7 shows system 700 including emulation system 701, controller 702, and host system 750.

FIG. 7 shows system 700 including emulation system 701, controller 702, and host system 750, in another embodiment of the present invention. As shown in FIG. 7, emulation system 701 and controller 702 communicates over a bidirectional serial interface 730. An arbitration procedure between control circuits 714 and 724 of emulation system 701 and controller 702, respectively, determines the direction of data flow between emulation system 701 and controller 702. Control circuits 714 and 724 control their respective transmitter and receiver to effectuate the data transfer. Controller 702 and emulation system 701 are sufficiently separated from each other to be effectively asynchronous to each other. Thus, the protocol of the present invention described above for communication between substantially asynchronous systems is applicable to communication on serial interface 730. Host system 750 communicates with controller 702 over an industry standard bus interface 751, such as the PCI bus.

Emulation system 701 includes user logic circuits 712, input/output buffers 713-1 to 713-*i*, transmitter 710, receiver 711 and control circuit 714. During operation, data to be transmitted from emulation system 701 to controller 702 or host system 750 are provided over input/output buffers 713-1 to 713-*i* to be transmitted over serial interface 730 to controller 702 and host system 750. Data from controller 702 or host system 750 are provided over serial interface 730 to receiver 711, which then provides the data to user logic circuits 712. User logic circuits 712, input/output buffers 713-1 to 713-*i*, transmitter 710, receiver 711 and control circuit 714 can all be configured in the programmable logic circuits (e.g., FPGAS) of emulation system 701.

As shown in FIG. 7, in controller 702, first-in-first-out (FIFO) memories are provided to allow data communicated between host system 750 and controller 702 over bus interface 751 to be queued at controller 702.

The detailed description above is provided to illustrate specific embodiments of the present invention and is not intended to be limiting. Numerous modifications and variations within the scope of the present invention are possible. The present invention is set forth in the following claims.

We claim:

1. In a logic emulation system, a method for transmitting a data packet between asynchronous components, comprising:

providing a transmit clock signal of a predetermined frequency;

transmitting serially over a connection between said asynchronous components, in accordance with said transmit clock signal, a framing sequence; and subsequent to transmitting said framing sequence, transmitting said data packet serially over said connection, wherein each bit in said framing sequence and said data packet is transmitted at a single level over two transmit clock periods.

2. In a logic emulation system, a method for receiving a data packet between asynchronous systems, comprising:

providing a receive clock signal of a predetermined frequency;

detecting a framing sequence transmitted serially over a connection between said asynchronous systems, in accordance with said receive clock signal; and subsequent to receiving said framing sequence, receiving said data packet serially over said connection, wherein each bit in said framing sequence and said data packet is received at a single level over two receive clock periods.

3. A method as in claim 2, wherein said asynchronous systems comprise two portions of an emulation circuit implemented on different circuit boards housed in separate chassis.

4. A method as in claim 2, wherein said asynchronous systems comprise a portion of an emulation circuit and a controller housed in a host computer.

5. A logic emulation system, comprising:

a circuit board including a plurality of programmable logic devices, said circuit board implementing an emulation circuit and a transmitter circuit, said circuit board receiving a clock signal of a predetermined frequency;

a controller coupled to a host computer, said controller having a receiver circuit and also receiving a clock signal of said predetermined frequency; and a connection between said transmitter circuit and said receiver circuit, wherein each bit of data transmitted over said connection is at a single level and has a duration of two or more periods of said clock signal received at said circuit board.

6. An emulation circuit as in claim 5, wherein said clock signal received at said circuit board and said clock signal received at said controller are provided by a common source.

7. An emulation circuit as in claim 5, wherein said clock signal received at said circuit board and said clock signal received at said controller are generated independently.

8. An emulation circuit as in claim 5, wherein said clock signal has the frequency of a virtual clock signal.

9. An emulation circuit as in claim 5, wherein said clock signal has twice the frequency of a virtual clock signal.

10. An emulation circuit as in claim 9, further comprising a phase-locked loop circuit for generating said clock signal from a virtual clock signal.

11. An emulation system, comprising:

a first circuit board including a plurality of programmable logic devices, said circuit board implementing an emulation circuit and a transmitter circuit, said circuit board receiving a clock signal of a predetermined frequency;

a second circuit board, said second circuit board having a receiver circuit and also receiving a clock signal of said predetermined frequency; and a connection between said transmitter circuit and said receiver circuit, wherein each bit of data transmitted over said connection is at a single level and has a duration of two or more periods of said clock signal received at said first circuit board.

12. An emulation circuit as in claim 11, wherein said clock signal received at said first circuit board and said clock signal received at said second circuit board are provided by a common source.

13. An emulation circuit as in claim 11, wherein said clock signal received at said first circuit board and said clock signal received at said second circuit board are generated independently.

14. An emulation circuit as in claim 11, wherein said clock signal has the frequency of a virtual clock signal.

15. An emulation circuit as in claim 11, wherein said clock signal has twice the frequency of a virtual clock signal.

16. An emulation circuit as in claim 15, further comprising a phase-locked loop circuit configured on said first circuit board for generating said clock signal from a virtual clock signal.

* * * * *